United States Patent [19]
Gamota et al.

[11] Patent Number: 5,704,116
[45] Date of Patent: Jan. 6, 1998

[54] METHOD OF HOLDING A COMPONENT USING AN ANHYDRIDE FLUXING AGENT

[75] Inventors: Daniel Roman Gamota; Steven Lewis Wille, both of Palatine; Steven Michael Scheifers, Hoffman Estates; Michael Hertsberg, Northbrook, all of Ill.

[73] Assignee: Motorola, Inc., Schaumburg, Ill.

[21] Appl. No.: 642,708

[22] Filed: May 3, 1996

[51] Int. Cl.⁶ .................... H05K 3/34; H05K 3/30
[52] U.S. Cl. .................. 29/840; 29/841; 228/180.22; 228/223
[58] Field of Search .............. 29/840, 841; 228/223, 228/207, 135, 175, 139, 180.22; 264/272.17

[56] References Cited

U.S. PATENT DOCUMENTS

| | | |
|---|---|---|
| 2,672,681 | 3/1954 | Klain . |
| 3,235,414 | 2/1966 | Marks . |
| 3,264,146 | 8/1966 | Marks . |
| 3,970,239 | 7/1976 | Hill . |
| 4,216,035 | 8/1980 | Bakos et al. . |
| 4,601,763 | 7/1986 | Stratil et al. ........................ 228/223 |
| 4,940,181 | 7/1990 | Juskey, Jr. et al. ............. 228/180.21 |
| 5,004,508 | 4/1991 | Mace et al. . |
| 5,122,200 | 6/1992 | Davis et al. . |
| 5,177,134 | 1/1993 | Mullen, III et al. . |
| 5,255,839 | 10/1993 | Da Costa Alves et al. ....... 228/180.21 |
| 5,386,624 | 2/1995 | George et al. ........................ 29/832 |
| 5,435,481 | 7/1995 | Da Costa Alves et al. ......... 228/223 |
| 5,442,240 | 8/1995 | Mukerji ............................... 257/783 |
| 5,499,756 | 3/1996 | Banerji et al. ................. 228/180.22 |
| 5,583,747 | 12/1996 | Baird et al. ..................... 228/180.21 |

Primary Examiner—P. W. Echols
Attorney, Agent, or Firm—Douglas D. Fekete; John B. MacIntyre

[57] ABSTRACT

A solution (20) is dispensed onto bond pads (18) on a substrate (14). An integrated circuit component (12) that includes solder bumps (16) formed on component bond pads (30) is superposed onto the substrate (14) such that the solder bumps (16) rest against the bond pads (18). The solution (20) includes an anhydride compound that acts as a fluxing agent. The subassembly (11) is heated to a temperature sufficient to bond the solder bumps (16) to the bond pads (18) to form solder bump interconnections (26). During the bonding process, the fluxing agent substantially vaporizes and leaves virtually no residue on the substrate (14) to allow the component (12) to be effectively underfilled with a polymeric encapsulant (24).

12 Claims, 1 Drawing Sheet

METHOD OF HOLDING A COMPONENT USING AN ANHYDRIDE FLUXING AGENT

FIELD OF THE INVENTION

This invention relates generally to a method for attaching an integrated circuit component to a substrate. More particularly, this invention relates to such a method wherein a fluxing agent containing an anhydride compound is dispensed onto bond pads on the substrate to temporarily hold the integrated circuit component.

BACKGROUND OF THE INVENTION

Integrated circuit components are attached to substrates, such as printed circuit boards, through solder bump interconnections that connect contacts, such as solder bumps, on the components to contacts, such as bond pads, on the substrate. The solder bump interconnections physically attach the component to the board and electrically connect an electrical circuit on the component to an electrical circuit on the substrate. In order to assure a reliable connection between the component solder bump and the substrate bond pad, the metallic surface of the bond pad should be free of oxidation, since oxidation inhibits the wetting of the surface and weakens the joint formed upon attachment.

It is known to apply a flux to the bond pads on a substrate to facilitate attachment of solder bump interconnections. The flux acts to remove the oxidation on the surface of the bond pad to provide a clean metallic surface that is prepared for attachment. However, when flux is applied to bond pads on a substrate, it has been difficult to prevent a component from shifting out of alignment during processing, particularly when carrying the substrate to a reflow oven or the like.

Tacking agents, such as camphor, have been used to secure components to substrates before and during the reflow process. However, the vaporization of the camphor generated at the temperatures sustained during reflow can skew the solder bumps from the bond pads, thereby misaligning the component solder bumps from the substrate bond pads. Further, tacking agents typically leave a residue on the surface of the substrate. This residue can weaken adhesion of a polymeric encapsulant used to underfill the component to protect the solder bump interconnections. Consequently, the surface of the substrate has to be cleaned prior to underfilling to remove the residue of the tacking agent in order to facilitate reliable adhesion between the encapsulant and the substrate.

Therefore, a need exists for a method for attaching an integrated circuit component to a substrate that holds the component during the formation of solder bump interconnections and that eliminates the step of cleaning the substrate surface of residue subsequent to reflow. Further, a need exists for a fluxing agent that will not corrode components or interconnections to a substrate or weaken a polymeric encapsulant used to support the interconnections.

DETAILED DESCRIPTION OF A PREFERRED EMBODIMENT

Figure 1:
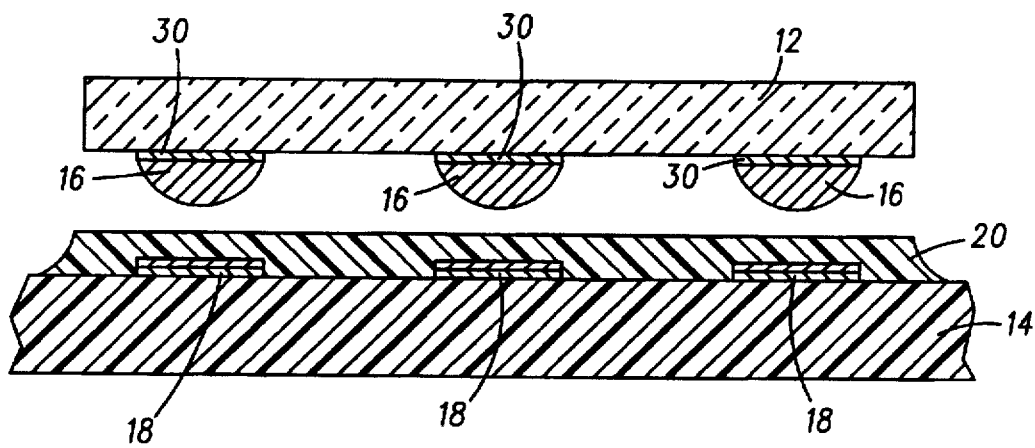
FIG. 1 is a cross-sectional view of an integrated circuit component overlying over a substrate coated with a solution comprising a fluxing agent in accordance with a preferred embodiment of the present invention.

In accordance with a preferred embodiment of the present invention, FIG. 1 shows an integrated circuit component 12 positioned above a substrate 14, such as a printed circuit board, in preparation for attachment. Component 12 is an integrated circuit die adapted for mounting on a substrate by a flip-chip process. Alternately, component 12 may be a ball grid array package wherein an integrated circuit chip is mounted on a carrier that is subsequently mounted on a substrate by solder bump interconnections. Solder bumps 16 are preferably composed of 97 weight percent lead and the balance substantially tin and are formed on component bond pads 30 located on face 28 of integrated circuit component 12. Bond pads 30 facilitate electrical connection to circuits on component 12 and are preferably formed of aluminum pads coated with a layer of chrome, which is in turn coated with a layer of copper.

Substrate 14 is preferably a printed circuit board, of the type referred to as an FR4 board, which is formed of a polymer layer laminated onto a ceramic or polymer/glass mesh core. Substrate bond pads 18 are preferably composed of solder-wettable copper that is coated with a layer of eutectic tin-lead solder formed of 63 weight percent tin and the balance substantially lead and having a melting temperature of about 183° C. The eutectic solder will, when in contact with solder bumps 16 and heated above 183° C., reflow about solder bumps 16 to form a solder bump interconnection between component 12 and substrate 14.

In a preferred embodiment, a solution 20 is dispensed onto bond pads 18 and acts as a flux to remove oxidation from the surface of bond pads 18 to provide a clean surface for a metallurgical interconnection. In an alternate embodiment, solution 20 is dispensed directly onto bond pads 18 using a mask. In a further alternate embodiment, solution 20 is applied to solder bumps 16 and is transferred to bond pads 18 upon superposition of component 12 onto substrate 14.

In a preferred embodiment, solution 20 comprises a fluxing agent dissolved in a vaporizable vehicle. A suitable vehicle is alcohol. The fluxing agent is composed of an anhydride compound that is effective to remove oxidation from bonds pads 18 to facilitate robust alloy formations between bond pads 18 and solder bumps 16. A preferred solution 20 comprises 10 weight percent methylhexahydrophthalic anhydride dissolved in isopropyl alcohol. Alternately, the solution may suitably comprise 10 weight percent methyltetrahydrophthalic anhydride dissolved in isopropyl alcohol. Other suitable anhydride compounds are alicyclic anhydrides. After dispensing, the vehicle starts to vaporize and produces a tacky layer formed of the anhydride in residual vehicle.

Figure 2:
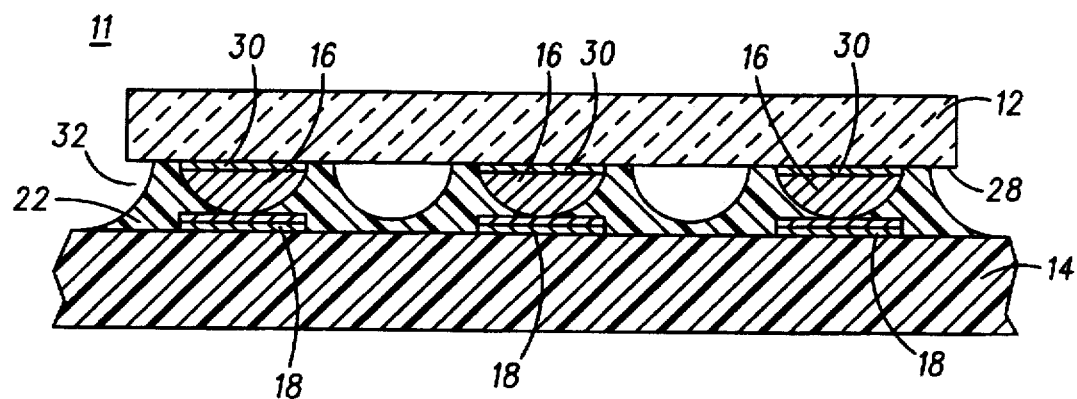
FIG. 2 is a cross-sectional view of the integrated circuit component and the substrate of FIG. 1 subsequent to superposing the integrated circuit component onto the substrate in accordance with a preferred embodiment of the present invention.

Referring to FIG. 2, in accordance with a preferred embodiment of the present invention, integrated circuit component 12 is superposed onto substrate 14 to form subassembly 11 such that each solder bump 16 registers with and rests against a bond pad 18. In a preferred embodiment, the residual vehicle is vaporized during temperature elevation to the liquidus temperature of the solder. The resulting tacky layer 22 is composed mainly of the anhydride compound and holds component 12 during the bonding of component 12 to substrate 14. In addition, tacky layer 22 acts as a flux to remove oxidation from bond pads 18 to provide a clean site for formation of solder bump interconnections that connect component 12 to substrate 14. Subassembly 11 is suitably carried to a reflow oven to bond solder bumps 16 to bond pads 18.

Figure 3:
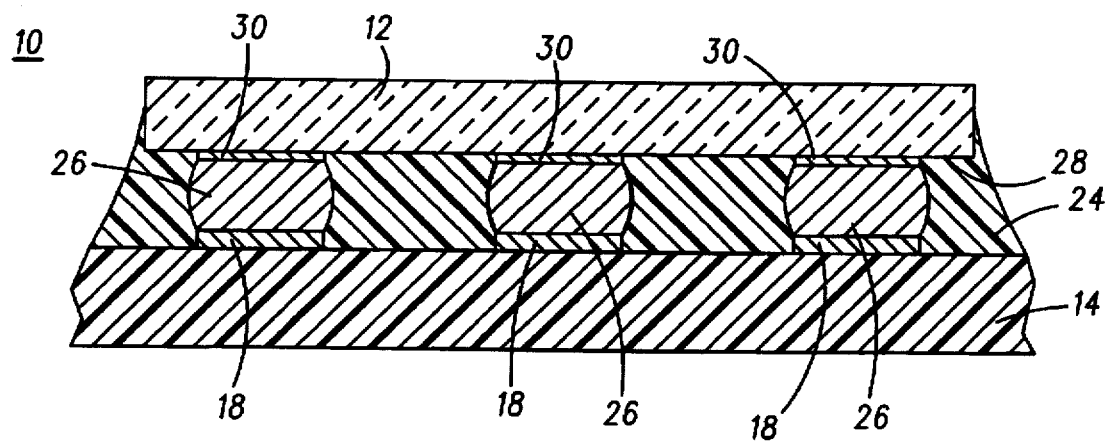
FIG. 3 is a cross-sectional view of a microelectronic assembly produce from the arrangement in FIG. 2 following solder reflow and encapsulation.

Component 12 and substrate 14 are reflowed at a temperature sufficient to bond component bond pads 30 to substrate bond pads 18 to form solder bump interconnections 26, as shown in FIG. 3. In a preferred embodiment, subassembly 11 is reflowed at a temperature above 183° C. Gap 32 is formed between face 28 and substrate 14 upon attachment of integrated circuit component 12 to substrate 14. During reflow, tacky layer 22 is substantially vaporized, thereby leaving a clean surface on substrate 14.

After integrated circuit component 12 is attached to substrate 14, a polymeric precursor is dispensed onto substrate 14 adjacent to integrated circuit component 12 and is drawn into gap 32 by capillary action. The precursor is preferably an epoxy-base resin that includes an anhydride hardener. The anhydride hardener is similar in chemistry to the anhydride compound used as the fluxing agent in the solution, thereby facilitating inclusion of any residue left after vaporization of the tacky layer to be incorporated into encapsulant 24. The precursor is preferably deposited on two adjacent sides of integrated circuit component 12 using a syringe or the like. In a preferred embodiment, assembly 10 is heated to a temperature of about 75° C. prior to the dispensing of the precursor. This preheating reduces the viscosity and enhances the flowability of the precursor into gap 32.

After gap 32 has been filled with the polymeric precursor, the precursor is cured by heating assembly 10 to a temperature sufficient to gel the epoxy-base prepolymer. The curing is carried out at a temperature less than the reflow temperature of solder bump interconnections 26, preferably between about 100° and 150° C., to form encapsulant 24. Encapsulant 24 includes epoxy end groups and hydroxyl end groups that react at the curing temperature with residual anhydride remaining after vaporization of the tacky layer. This facilitates inclusion of any anhydride residue into encapsulant 24. Encapsulant 24 surrounds solder bump interconnections 26 and improves the reliability of assembly 10 by protecting solder bump interconnections 26 from exposure to environmental damage and providing enhanced mechanical support for interconnections 16.

One advantage of this invention is that any residual anhydride tacking agent is readily solubilized into the encapsulant to promote adhesion of the encapsulant. This is in marked contrast to prior tacking agents, commonly camphor, which typically leave a residue on the surface of the substrate that is not soluble in the encapsulant and needs to be removed by washing or the like. Consequently, adhesion of an underfilling encapsulant is diminished.

Thus, this invention provides a method for attaching an integrated circuit component to a substrate by dispensing a solution to bond pads on the substrate. The solution includes an anhydride compound dissolved in a vaporizable vehicle. After dispensing, the vehicle is vaporized to leave the anhydride compound as a tacky layer on the bond pads. The tacky anhydride layer act as a tacking agent to hold the component, and further acts as a fluxing agent to prepare the surface of the bond pads for attachment to solder bumps on the component through solder bump interconnections. The anhydride preferably vaporizes during reflow of the solder bump interconnections, and leaves no residue on the board, thereby facilitating effective underfilling of the component with a polymeric encapsulant. However, if any anhydride residue remains on the surface of the substrate, the residue is readily solubilized into the encapsulant, which includes an anhydride hardener that is similar in composition to the anhydride in the fluxing agent.

In this manner, the substrate surface does not need to be cleaned prior to underfilling encapsulation. Further, good encapsulation adhesion is achieved by incorporating any anhydride residue into the encapsulant. The anhydride layer on the bond pads is effective to hold the component during the transfer of the substrate to the reflow process, thereby facilitating proper alignment of the component on the substrate. Also, using an anhydride fluxing agent allows for a more reliable connection than a fluxing agent that includes an acid, since anhydrides are more dielectric than acids and consequently lead to better insulation and a lower chance of shorts between leads on the substrate.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for attaching an integrated circuit component comprising a plurality of solder bumps to a substrate comprising a plurality of bond pads, the method comprising:
   dispensing a solution onto the bond pads, said solution comprising a fluxing agent composed of an anhydride compound;
   superposing the integrated circuit component onto the substrate such that each of said solder bump rests against one of the bond pads and is held by the fluxing agent; and
   heating to bond the solder bumps to the bond pads and to vaporize the anhydride compound.

2. A method in accordance with claim 1, wherein the anhydride compound is methylhexahydrophthalic anhydride compound.

3. A method in accordance with claim 2, wherein the solution comprises methylhexahydrophthalic anhydride compound dissolved in a vaporizable vehicle.

4. A method in accordance with claim 1, wherein the anhydride compound is methyltetrahydrophthalic anhydride compound.

5. A method in accordance with claim 4, wherein the solution comprises methyltetrahydrophthalic anhydride compound dissolved in a vaporizable vehicle.

6. A method in accordance with claim 1, wherein the step of heating reflows a solder layer formed on the bond pads.

7. A method for attaching an integrated circuit component comprising a plurality of solder bumps to a substrate comprising a plurality of bond pads, the method comprising:
   dispensing a solution comprising a fluxing agent composed of an anhydride compound and dissolved in a vaporizable vehicle onto the substrate including the bond pads;
   vaporizing the vehicle to form a tacky layer on the bond pads;
   superposing an integrated circuit component onto the substrate such that each of said solder bump rests against one of the bond pads and is held by the tacky layer, and such that a gap is formed between the integrated circuit component and the substrate;
   heating to bond the solder bumps to the bond pads and to vaporize the anhydride compound; and
   filling the gap with a polymeric encapsulant.

8. A method in accordance with claim 7, wherein the solution consists essentially of methylhexahydrophthalic anhydride in vaporizable alcohol.

9. A method in accordance with claim 7, further comprising the step of removing the anhydride compound vapors from the gap.

10. A method in accordance with claim 7, wherein the polymeric encapsulant is formed of a resinous composition that cures at a curing temperature, wherein the polymeric encapsulant reacts with residual anhydride at the curing temperature.

11. A method in accordance with claim 7, wherein the step of heating reflows a solder layer formed on the bond pads.

12. A method for attaching an integrated circuit component comprising a plurality of solder bumps to a substrate comprising a plurality of bond pads, the method comprising:

dispensing a solution composed of an anhydride compound dissolved in vaporizable alcohol onto the substrate such that the solution is applied to the bond pads;

vaporizing the alcohol to form a tacky anhydride layer on the bond pads;

superposing the integrated circuit component onto the substrate such that each of said solder bumps rests against one of the bond pads and is held by the tacky anhydride layer, and such that a gap is formed between the integrated circuit component and the substrate;

heating to bond the solder bumps to the bond pads and to vaporize the tacky anhydride layer; and filling the gap with an epoxy-base resinous encapsulant that cures at a curing temperature and includes epoxy end groups and hydroxyl end groups that react with residual anhydride at the curing temperature.

* * * * *

UNITED STATES PATENT AND TRADEMARK OFFICE
CERTIFICATE OF CORRECTION

PATENT NO. : 5,704,116

DATED : January 6, 1998

INVENTOR(S) : Daniel R. Gamota et.al.

It is certified that error appears in the above-indentified patent and that said Letters Patent is hereby corrected as shown below:

Col. 4, line 30, "bump" should be --bumps--.

Col. 4, line 58, "bump" should be --bumps--.

Signed and Sealed this

Seventeenth Day of March, 1998

Attest:

BRUCE LEHMAN

Attesting Officer

Commissioner of Patents and Trademarks